(12) United States Patent
Inoue et al.

(10) Patent No.: US 6,614,107 B2
(45) Date of Patent: Sep. 2, 2003

(54) THIN-FILM HEAT SINK AND METHOD OF MANUFACTURING SAME

(75) Inventors: Tohru Inoue, Tokyo (JP); Shigeki Tanemura, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 09/987,684

(22) Filed: Nov. 15, 2001

(65) Prior Publication Data

US 2002/0081778 A1 Jun. 27, 2002

(30) Foreign Application Priority Data

Nov. 28, 2000 (JP) ........................................ 2000-360929

(51) Int. Cl.$^7$ ........................... H01L 23/10; H01L 23/34
(52) U.S. Cl. ........................ 257/706; 257/717; 257/720; 257/796; 257/625; 257/675; 257/712
(58) Field of Search .................. 257/712, 473, 257/625, 675, 706, 717, 720, 796; 360/126, 121, 320, 319, 324.1; 29/603; 438/122, 118, 107

(56) References Cited

U.S. PATENT DOCUMENTS 3,896,479 A * 7/1975 Di Lorenzo et al. ........ 257/473
6,252,749 B1   6/2001 Hayakawa

FOREIGN PATENT DOCUMENTS

JP   11-154310 A   6/1999
JP   11-154310   *   6/1999

* cited by examiner

*Primary Examiner*—Minhloan Tran
*Assistant Examiner*—Tan Tran
(74) *Attorney, Agent, or Firm*—Oliff & Berridge, PLC.

(57) ABSTRACT

A thin-film heat sink comprises a heat sink film functioning as a heat sink and a bonding film for bonding the heat sink film to a base. The bonding film is an aluminum oxide ($Al_2O_3$) film formed using the CVD method and the heat sink film is an aluminum nitride (AlN) film. For the AlN film as the heat sink film, internal stress is compressive stress, whereas for the $Al_2O_3$ film as the bonding film, internal stress is tensile stress.

8 Claims, 5 Drawing Sheets

THIN-FILM HEAT SINK AND METHOD OF MANUFACTURING SAME

BACKGROUND OF THE INVENTION

1. Field of the Invention

The present invention relates to a thin-film heat sink made of a thin film and a method of manufacturing the same.

2. Description of the Related Art

A heat sink is used to radiate heat generated from electronic components rapidly and to cool elements. Typical materials used for heat sinks include diamond, silicon carbide (SiC) and aluminum nitride (AlN). Bulk AlN has thermal conductivity of 170 W/mK or more, which is eight to ten times higher than that of aluminum oxide ($Al_2O_3$).

For thin-film magnetic heads, especially those incorporating giant magneto-resistive (GMR) elements that exhibit GMR effect, consideration is being given to the use of thin-film heat sinks, formed of materials having high thermal conductivity, as various insulating films in the heads in order to reduce noise arising from heat generated from read elements.

For making the thin-film heat sinks for the above-mentioned heads, it is preferred to use films that can be formed at relatively low temperatures (substrate temperature within a range from room temperature to 200° C.), so as to prevent destruction of read elements by heat generated when the thin-film heat sinks are formed.

To form films with a structure providing good thermal conductivity, a substrate temperature required for diamond is 600 to 800° C. and that for SiC is 300 to 600° C. On the other hand, a substrate temperature required for AlN ranges from room temperature to 200° C. In view of this, it has been proposed to use AlN films instead of conventional $Al_2O_3$ films for various insulating films in the thin-film magnetic heads to reduce noise arising from heat generated from read elements.

However, AlN films have a compressive stress as high as $10^8$ to $10^9$ Pa, which is about ten times that for $Al_2O_3$ films formed by sputtering. The compressive stress causes two problems: deterioration in adhesiveness of the AlN film to a base, and generation of noise arising from the stress.

As a solution to the problem of deterioration in adhesiveness of AlN films to a base, a method has been proposed, in which an $Al_2O_3$ film is formed on a base by conventional sputtering method and an AlN film is formed thereon to improve the adhesiveness of the AlN film, as disclosed in Published Unexamined Japanese Patent Application (KOKAI) Heisei 11-154310 (1999), for example.

This method has an effect of making the AlN film adhere to the base via the $Al_2O_3$ film. However, it does not reduce the internal stress of the AlN film. It means that this method cannot reduce noise generated in read signals when, for example, a thin-film heat sink including an AlN film is provided near a GMR element.

To implement a thin-film heat sink with a sufficient property as a heat sink, it is desirable that the thin-film heat sink has a thickness of 100 nm or more. However, since the internal stress of a thin-film heat sink increases with an increase in its thickness, the problem resulting from the internal stress becomes more remarkable as the thickness of the thin-film heat sink is made greater.

OBJECT AND SUMMARY OF THE INVENTION

It is an object of the invention to provide a thin-film heat sink with high thermal conductivity, high adhesiveness to a base and low internal stress, and to a method of manufacturing such a thin-film heat sink.

A thin-film heat sink of the invention comprises: a heat sink film functioning as a heat sink; and a bonding film for bonding the heat sink film to a base, wherein: one of the heat sink film and the bonding film is a film of which internal stress is compressive stress, and the other is a film of which internal stress is tensile stress.

According to the thin-film heat sink of the invention, the heat sink film having high thermal conductivity is bonded to the base via the bonding film. It is therefore possible to enhance adhesiveness of the thin-film heat sink to the base while attaining high thermal conductivity of the thin-film heat sink. Furthermore, according to the invention, the heat sink film and the bonding film have internal stresses in opposite directions. It is therefore possible to reduce the internal stress of the thin-film heat sink as a whole.

In the thin-film heat sink of the invention, the heat sink film may be a film of which internal stress is compressive stress, while the bonding film may be a film of which internal stress is tensile stress.

In the thin-film heat sink of the invention, the heat sink film may be an aluminum nitride (AlN) film.

In the thin-film heat sink of the invention, the bonding film may be an aluminum oxide ($Al_2O_3$) film formed through chemical vapor deposition.

In the thin-film heat sink of the invention, the bonding film may be a nitrogen-excessive silicon nitride ($SiN_x$, where x is larger than one) film.

The thin-film heat sink of the invention may have a structure in which a plurality of heat sink films and a plurality of bonding films are alternately stacked.

In the thin-film heat sink of the invention, the heat sink film may have thermal conductivity of 0.8 W/mK or higher as thin film.

The thin-film heat sink of the invention may be used as an insulating layer of a thin-film magnetic head.

A method of the invention is provided for manufacturing a thin-film heat sink comprising a heat sink film functioning as a heat sink, and a bonding film for bonding the heat sink film to a base. The method includes the steps of: forming the bonding film on the base; and forming the heat sink film on the bonding film, wherein: one of the heat sink film and the bonding film is a film of which internal stress is compressive stress, and the other is a film of which internal stress is tensile stress.

According to the method of manufacturing a thin-film heat sink of the invention, the heat sink film having high thermal conductivity is bonded to the base via the bonding film. It is therefore possible to enhance adhesiveness of the thin-film heat sink to the base while attaining high thermal conductivity of the thin-film heat sink. Furthermore, according to the invention, the heat sink film and the bonding film have internal stresses in opposite directions. It is therefore possible to reduce the internal stress of the thin-film heat sink as a whole.

In the method of manufacturing a thin-film heat sink of the invention, the heat sink film may be a film of which internal stress is compressive stress, while the bonding film may be a film of which internal stress is tensile stress.

In the method of manufacturing a thin-film heat sink of the invention, the heat sink film may be formed of an aluminum nitride (AlN) film.

In the method of manufacturing a thin-film heat sink of the invention, an aluminum oxide ($Al_2O_3$) film as the bonding film may be formed through chemical vapor deposition in the step of forming the bonding film.

In the method of manufacturing a thin-film heat sink of the invention, the bonding film may be formed of a nitrogen-excessive silicon nitride ($SiN_x$, where x is larger than one) film.

In the method of manufacturing a thin-film heat sink of the invention, the step of forming the bonding film and the step of forming the heat sink film may be alternately performed a plurality of times to make a thin-film heat sink having a structure in which a plurality of heat sink films and a plurality of bonding films are alternately stacked.

In the method of manufacturing a thin-film heat sink of the invention, the heat sink film may have thermal conductivity of 0.8 W/mK or higher as thin film.

The method of manufacturing a thin-film heat sink of the invention may manufacture a thin-film heat sink used as an insulating layer of a thin-film magnetic head.

Other and further objects, features and advantages of the invention will appear more fully from the following description.

DETAILED DESCRIPTION OF THE PREFERRED EMBODIMENTS

Preferred embodiments of the invention will now be described in detail with reference to the accompanying drawings.

[First Embodiment]

Figure 1:
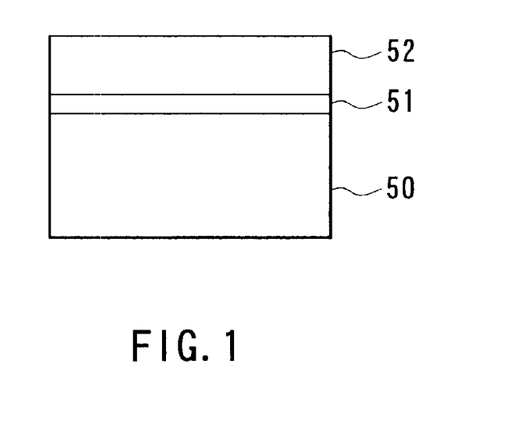
FIG. 1 is an explanatory view illustrating a structure of a thin-film head sink of a first embodiment of the invention.

Reference is now made to FIG. 1 to describe a structure of a thin-film heat sink of a first embodiment of the invention. The thin-film heat sink of the embodiment comprises a heat sink film 52 functioning as a heat sink, and a bonding film 51 for bonding the heat sink film 52 to a base 50. One of the heat sink film 52 and the bonding film 51 is a film whose internal stress is compressive stress, while the other is a film whose internal stress is tensile stress. It is preferable that the heat sink film 52 has a thermal conductivity of 0.8 W/mK or higher as thin film.

In the present embodiment, an aluminum nitride (AlN) film is used as the heat sink film 52. The AlN film may be formed by any method, such as sputtering, CVD method and vacuum evaporation method. In a method of manufacturing the thin-film heat sink of the embodiment, the AlN film is formed through sputtering. In addition, an aluminum oxide ($Al_2O_3$) film bonding film 51 in the present embodiment.

For the AlN film as the heat sink film 52, the internal stress is compressive stress. For the $Al_2O_3$ film as the bonding film 51 formed by CVD method, the internal stress is tensile stress, as inter-atomic bond length reduces during the film formation and as there is no increase in film stress resulting from ion implantation caused in a plasma process such as sputtering.

The thermal conductivity of the AlN film as the heat sink film 52 is 0.8 W/mK or higher as a thin film. The $Al_2O_3$ film as the bonding film 51 has good adhesiveness to the base 50 and to the AlN film. According to the embodiment, by bonding the heat sink film 52 with high thermal conductivity to the base 50 via the bonding film 51, it is possible to enhance adhesiveness of the thin-film heat sink to the base 50 while attaining high thermal conductivity of the thin-film heat sink. Further, in the embodiment, the heat sink film 52 and the bonding film 51 have internal stresses in opposite directions, and therefore the thin-film heat sink as a whole has smaller internal stress.

The method of manufacturing the thin-film heat sink of the embodiment is now described. The $Al_2O_3$ film as the bonding film 51 is formed using the CVD method, preferably by the thermal CVD method. For the material, the trimethylaluminum (TMA) ($Al(CH_3)_3$)/water ($H_2O$) system or aluminum chloride ($AlCl_3$)/water system may be used. In the CVD process, the substrate temperature is 300° C. or lower, preferably 200° C.

The AlN film as the heat sink film 52 is formed through the CVD process subsequent to the formation of the $Al_2O_3$ film through the same CVD process. As the material for forming the AlN film through the CVD process, TMA/ammonia ($NH_3$) system may be used. Alternatively, after forming the $Al_2O_3$ film with a CVD device, the substrate may be moved to a sputtering device connected to the CVD device or through release to the atmosphere to form the AlN film through the sputtering process. In particular, it is more desirable to form the AlN film through the electron cyclotron resonant (ECR) sputtering process, as it forms a polycrystalline AlN film oriented to (002) plane providing good thermal conductivity. In the embodiment, the AlN film as the heat sink film 52 is formed through the sputtering process. In a second embodiment described later, an AlN film as a heat sink film is formed in the CVD process.

An example of the embodiment is now described. In the example, a 30-nm-thick $Al_2O_3$ film formed through the CVD process is used as the bonding film 51 and a 120-nm-thick AlN film formed through the ECR sputtering process is used as the heat sink film 52. A specific example of the method of manufacturing the thin-film heat sink of the example is now described.

Figure 2:
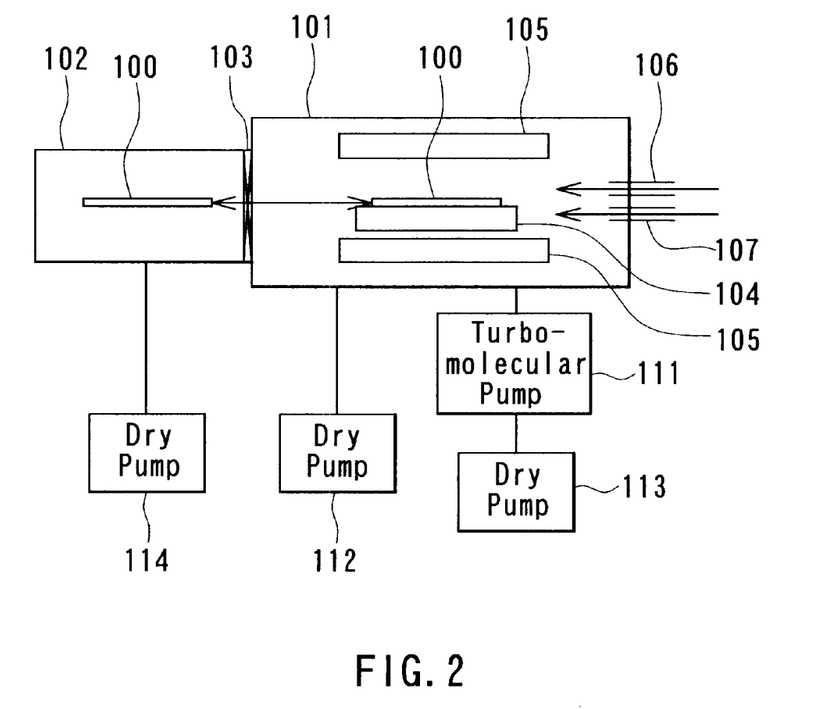
FIG. 2 is an explanatory view illustrating an example of a configuration of a CVD device for forming an $Al_2O_3$ film as the bonding film in FIG. 1.

FIG. 2 is an explanatory view illustrating an example of a configuration of a CVD device for forming the $Al_2O_3$ film as the bonding film 51. The CVD device comprises a reaction chamber 101 and a load lock chamber 102 connected to the reaction chamber 101 via a gate valve 103. A substrate stage 104 and a heater 105 are provided inside the reaction chamber 101. Material supply routes 106 and 107 are connected to the reaction chamber 101. A turbomolecular pump 111 and a dry pump 112 are also connected to the reaction chamber 101. A dry pump 113 for roughing is connected to the turbomolecular pump 111, and a dry pump 114 is connected to the load lock chamber 102.

The $Al_2O_3$ film as the bonding film 51 in this example is formed using the CVD device shown in FIG. 2 in the following manner, for example. First, the turbomolecular pump 111 is used to evacuate the reaction chamber 101 to reduce the internal pressure to $4\times10^{-5}$ Pa or lower. At this time the temperature of the substrate stage 104 is kept at 200° C. with the heater 105. Next, a six-inch (100) plane silicon (Si) substrate 100 as the base 50 of the thin-film heat sink is moved from the load lock chamber 102 onto the substrate stage 104 in the reaction chamber 101. Next, the gate valve 103 is closed, the exhaust system in the reaction chamber 101 is switched from the turbomolecular pump 111 to the dry pump 112 and it is retained for 10 minutes. Next, TMA as a source of aluminum and $H_2O$ are alternately supplied from the material supply routes 106 and 107 respectively to the reaction chamber 101, for example 300 times each. A single supply of TMA and $H_2O$ produces chemical reaction of the two substances to form a thin $Al_2O_3$ film on the substrate 100. By performing the supply of TMA and $H_2O$ a plurality of times, a plurality of thin $Al_2O_3$ films are stacked on the substrate 100. Thus, an $Al_2O_3$ film with a desired thickness is formed. Next, the turbomolecular pump 111 is used to evacuate the reaction chamber 101 to reduce the internal pressure to $4\times10^{-5}$ Pa or lower. Next, the substrate 100 is moved from the substrate stage 104 in the reaction chamber 101 to the load lock chamber 102. Next, the substrate 100 is withdrawn. In this way, the $Al_2O_3$ film as the bonding film 51 is formed to a thickness of 30 nm.

Figure 3:
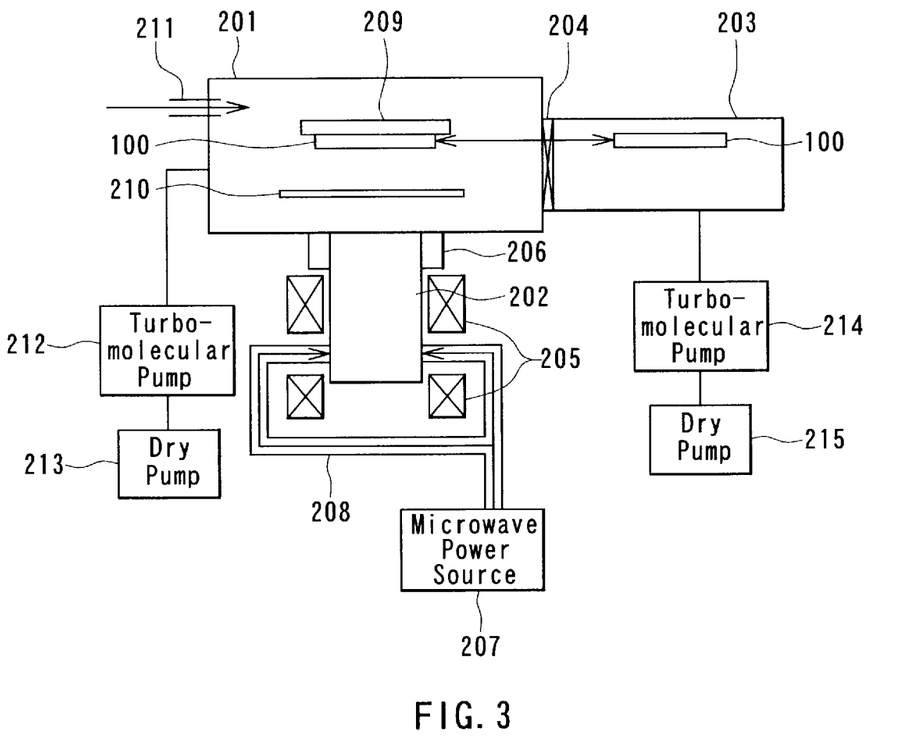
FIG. 3 is an explanatory view illustrating an example of a configuration of an ECR sputtering device for forming an AlN film as the heat sink film in FIG. 1.

FIG. 3 is an explanatory view illustrating an example of a configuration of an ECR sputtering device for forming the AlN film as the heat sink film 52. The ECR sputtering device comprises: a film forming chamber 201; an ECR chamber 202 connected to the film forming chamber 201; and a load lock chamber 203 connected to the film forming chamber 201 via a gate valve 204. A magnet coil 205 is provided around the ECR chamber 202. A ring-shaped Al target 206 is provided in the ECR chamber 202. A microwave power source 207 is connected to the ECR chamber 202 via a branched square wave guide tube 208. Inside the film forming chamber 201, there are a substrate stage 209 and a shutter 210 placed between the substrate stage 209 and the ECR chamber 202. A gas supply route 211 and a turbomolecular pump 212 are connected to the film forming chamber 201. A dry pump 213 for roughing is connected to the turbomolecular pump 212. A turbomolecular pump 214 is connected to the load lock chamber 203. A dry pump 215 for roughing is connected to the turbomolecular pump 214.

The AlN film as the heat sink film 52 of this example is formed using the ECR sputtering device shown in FIG. 3 in the following manner, for example. First, the turbomolecular pump 212 is used to evacuate the ECR chamber 202 and the film forming chamber 201 to reduce their internal pressures to $2\times10^{-5}$ Pa or lower. Next, the substrate 100 on which the $Al_2O_3$ film has been formed using the CVD device shown in FIG. 2, for example, is moved from the load lock chamber 203 onto the substrate stage 209 in the film forming chamber 201. Next, the gate valve 204 is closed, and the turbomolecular pump 212 is used again to evacuate the ECR chamber 202 and the film forming chamber 201 to reduce their internal pressures to $2\times10^{-5}$ Pa or lower. Ar gas and $N_2$ gas are then supplied through the gas supply route 211 to the film forming chamber 201 at the flow rates of 20 sccm and 15 sccm, respectively, although the flow rates vary depending on ECR sputtering device. Next, an electric current is fed to the magnet coil 205 to generate a magnetic field of 0.0875 T. Then, a microwave at 2.45 GHz is supplied from the microwave power source 207 via the wave guide tube 208 to the ECR chamber 202 to excite ECR discharge. Next, an electromagnetic wave at 13.56 MHz is applied to the Al target 206 to induce self-bias on the Al target 206. Next, the shutter 210 is kept open for a specific length of time for film forming. After the time for film forming has passed, the shutter 210 is closed and the applications of the electromagnetic wave and the magnetic field as well as the gas supply are all stopped. Next, the turbomolecular pump 212 is used to evacuate the ECR chamber 202 and the film forming chamber 201 to reduce their internal pressures to $2\times10^{-5}$ Pa or lower. The substrate 100 is then moved from the substrate stage 209 in the film forming chamber 201 to the load lock chamber 203. Then, the gate valve 204 is closed, the load lock chamber 203 is made open to the atmosphere, and the substrate 100 is withdrawn. In this way, the AlN film as the heat sink film 52 is formed to a thickness of 120 nm on the $Al_2O_3$ film on the substrate 100.

The results of evaluation on the thin-film heat sink of the foregoing example and two thin-film heat sinks of comparative examples in terms of adhesiveness to a base and internal stress will now be described.

Figure 4:
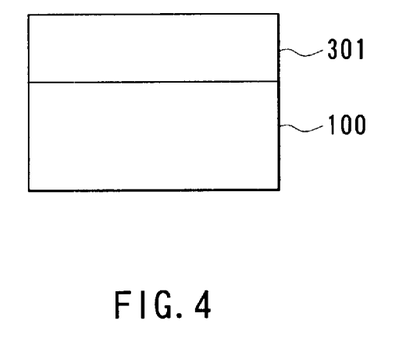
FIG. 4 is an explanatory view illustrating a structure of a thin-film heat sink of a first comparative example for comparison with an example of the first embodiment of the invention.

First, reference is made to FIG. 4 to describe a thin-film heat sink of a first comparative example. The thin-film heat sink of the first comparative example is made up of a 120-nm-thick AlN film 301 formed on the silicon substrate 100 through the ECR sputtering process. The method of forming the AlN film 301 is the same as the method of forming the AlN film in the example of the embodiment.

Figure 5:
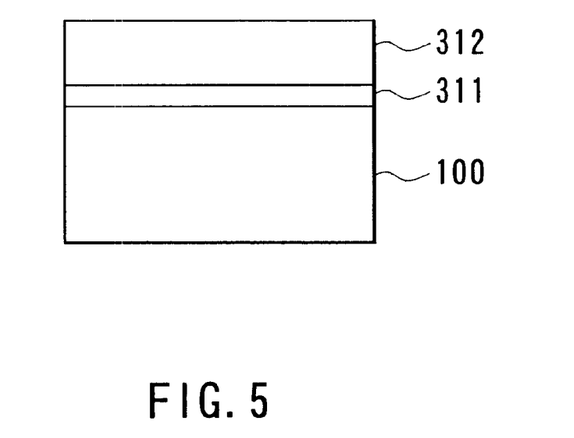
FIG. 5 is an explanatory view illustrating a structure of a thin-film heat sink of a second comparative example for comparison with the example of the first embodiment of the invention.

Next, reference is made to FIG. 5 to describe a thin-film heat sink of a second comparative example. The thin-film heat sink of the second comparative example is made up of a 30-nm-thick $Al_2O_3$ film 311 formed on the silicon substrate 100 through the ECR sputtering process and a 120-nm-thick AlN film 312 subsequently formed on the $Al_2O_3$ film 311 through the ECR sputtering process. The $Al_2O_3$ film 311 was formed using $O_2$ gas at the flow rate of 4 sccm instead of the $N_2$ gas used in the method of forming the AlN film of the example of the embodiment. The method of forming the AlN film 312 is the same as the method of forming the AlN film in the example of the embodiment.

Next, a method of evaluating the thin-film heat sink in terms of adhesiveness to the base is described. Here, the adhesiveness was evaluated using a Vickers hardness meter used for measurement of hardness. In this method, a Vickers indenter is first pressed into the entire surface of the thin-film heat sink with a load ranging from 25 gf (approximate to 245 mN) to 100 gf (approximate to 980 mN). After that, when the surface of the thin-film heat sink is measured using a Vickers hardness meter, an interference fringe appears around the indentation if peeling of the thin-film heat sink has occurred, whereas an interference fringes is only found at the portion destroyed by the indenter if the adhesiveness of the thin-film heat sink is in a good state without any peeling. The measurement was repeated 250 times and the ratio of occurrence of interference fringes in an area larger than the approximate size of the indenter was deemed the peeling occurrence rate.

Figure 6:
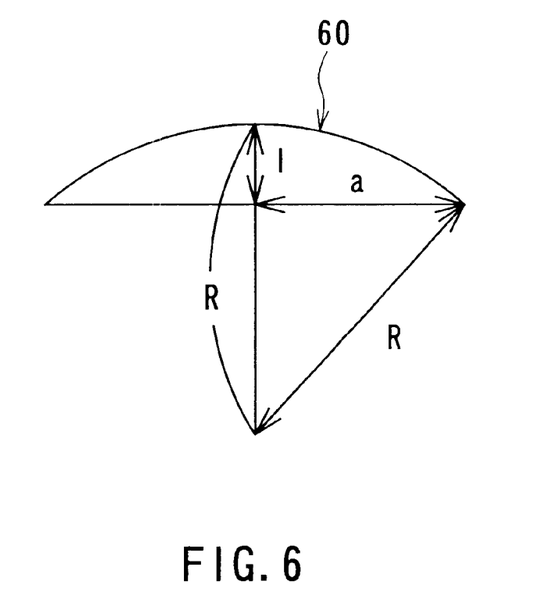
FIG. 6 is an explanatory view illustrating how to determine internal stress using the deflection method.

Next, a method of evaluating the thin-film heat sink in terms of internal stress is described. Here, the evaluation used the deflection method to determine internal stress from deflection of a substrate. The deflection method is relatively easy and is often used to evaluate the internal stress of thin films. Reference is now made to FIG. 6 to describe how to determine internal stress in the deflection method. In this method, first, a surface configuration of the substrate before formation of a thin film is measured using a probe-type surface roughness meter. Next, a surface configuration of the substrate after formation of the thin film is measured using the probe-type surface roughness meter. Then, the surface configurations of the substrate before and after formation of the thin film are compared to obtain a deflection curve indicating displacement of the substrate arising from formation of the thin film. The curve shown with numeral 60 in FIG. 6 indicates the deflection curve. In FIG. 6, symbol "a" indicates half length of the chord for the deflection curve 60, symbol "l" indicates the maximum displacement between the deflection curve 60 and the chord, and symbol "R" indicates the radius of the deflection curve 60. The half length a of the chord is easily determined from the scanning length in the measurement of the surface configuration of the substrate, and the maximum displacement l is determined through measurement of the surface configuration of the substrate. The radius R of the deflection curve 60 is expressed by the following equation (1).

$$R = (l^2 + a^2)/2l \quad (1)$$

The total stress of a thin film is defined by the following equation (2).

$$S = (E_s D_s^2)/6(1-\nu) \cdot R \quad (2)$$

In equation (2), $E_s$ is a Young's modulus of a substrate, $D_s$ is the thickness of the substrate, and $\nu$ is the Poisson's ratio of the substrate. For $E_s$ and $\nu$, substitution of their respective document values is made. Substitution of R obtained in equation (1) into equation (2) provides the total stress S of the thin film. The true stress, or the internal stress, of the thin film is obtained by dividing the total stress S of the thin film by the thickness of the thin film.

The peeling occurrence rate for the thin-film heat sink of the first comparative example was 45 percent at a load of 25 gf (approximate to 245 mN) applied with the indenter, 56 percent at 50 gf (approximate to 490 mN) and 72 percent at 100 gf (approximate to 980 mN). The internal stress of the thin-film heat sink of the first comparative example was $6.3 \times 10^{10}$ dyn/cm$^2$ ($6.3 \times 10^9$ N/m$^2$), which is an appropriate value for the internal stress of a single AlN film.

The peeling occurrence rate for the thin-film heat sink of the second comparative example was 12 percent at a load of 25 gf applied with the indenter, 18 percent at 50 gf and 28 percent at 100 gf The internal stress of the thin-film heat sink of the second comparative example was 4.3 to $6.2 \times 10^9$ dyn/cm$^2$ (4.3 to $6.2 \times 10^8$ N/m$^2$), which is an appropriate value for the compound internal stress of an AlN film and an Al$_2$O$_3$ film.

The peeling occurrence rate for the thin-film heat sink of the example of the embodiment was 4 percent at a load of 25 gf applied with the indenter, 7 percent at 50 gf and 14 percent at 100 gf. The internal stress of the thin-film heat sink of the example was 3.8 to $5.7 \times 10^6$ dyn/cm$^2$ (3.8 to $5.7 \times 10^5$ N/m$^2$), which was the lower limit of values measurable by the deflection method.

These results demonstrate that the thin-film heat sink of the example of the embodiment has higher adhesiveness to the base and smaller internal stress than those of the two comparative examples.

[Second Embodiment]

Figure 7:
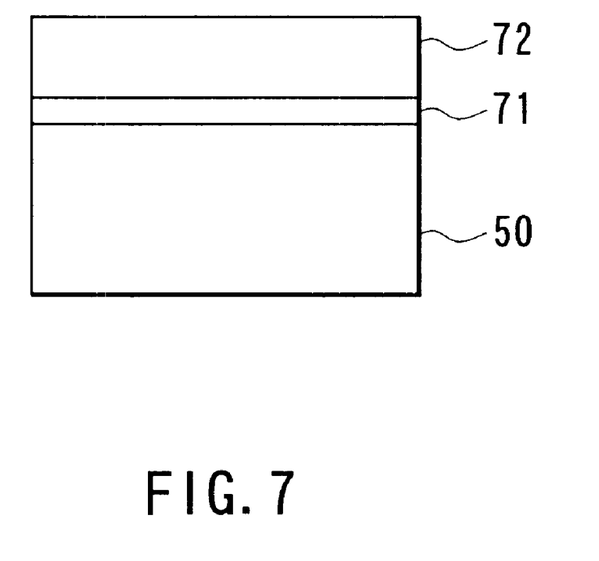
FIG. 7 is an explanatory view illustrating a structure of a thin-film head sink of a second embodiment of the invention.

Reference is now made to FIG. 7 to describe a structure of a thin-film heat sink of a second embodiment of the invention. The thin-film heat sink of this embodiment comprises a heat sink film 72 functioning as a heat sink, and a bonding film 71 for bonding the heat sink film 72 to the base 50. In the present embodiment, an Al$_2$O$_3$ film formed through the CVD process is used as the bonding film 71 and an AlN film formed through the CVD process is used as the heat sink film 72.

According to the method of manufacturing the thin-film heat sink of the present embodiment, the Al$_2$O$_3$ film as the bonding film 71 is formed on the base 50 using the CVD method and the AlN film as the heat sink film 72 is formed on the Al$_2$O$_3$ film, also using the CVD method. The Al$_2$O$_3$ film and the AlN film may be consecutively formed through the CVD process.

In the present embodiment, as in the first embodiment, internal stress is compressive stress for the AlN film as the heat sink film 72, whereas internal stress is tensile stress for the Al$_2$O$_3$ film as the bonding film 71.

According to an example of the present embodiment, the Al$_2$O$_3$ film as the bonding film 71 is 30 nm thick and the AlN film as the heat sink film 72 is 120 nm thick.

A specific example of a method of manufacturing the thin-film heat sink of the example of the embodiment is now described. In the example, the Al$_2$O$_3$ film as the bonding film 71 is formed by the same method as that of forming the Al$_2$O$_3$ film as the bonding film 51 of the example of the first embodiment. In the example of the present embodiment, the AlN film as the heat sink film 72 was consecutively formed after formation of the Al$_2$O$_3$ film using the same CVD device. The method of forming the AlN film is the same as that of forming the Al$_2$O$_3$ film as the bonding film 71, except for using NH$_3$ instead of H$_2$O and for alternately supplying TMA and NH$_3$.

The peeling occurrence rate for the thin-film heat sink of the example of the embodiment was three percent at a load of 25 gf applied with the indenter, nine percent at 50 gf and 12 percent at 100 gf. The internal stress of the thin-film heat sink of the example was 4.3 to $9.8 \times 10^5$ dyn/cm$^2$ (4.3 to $9.8 \times 10^4$ N/m$^2$), which was the lower limit of values measurable by the deflection method. The results demonstrate that the thin-film heat sink of the example of the embodiment has higher adhesiveness to the base and smaller internal stress than those of the two comparative examples in the first embodiment.

The remainder of the configuration, functions and effects of the present embodiment are similar to those of the first embodiment.

[Third Embodiment]

Figure 8:
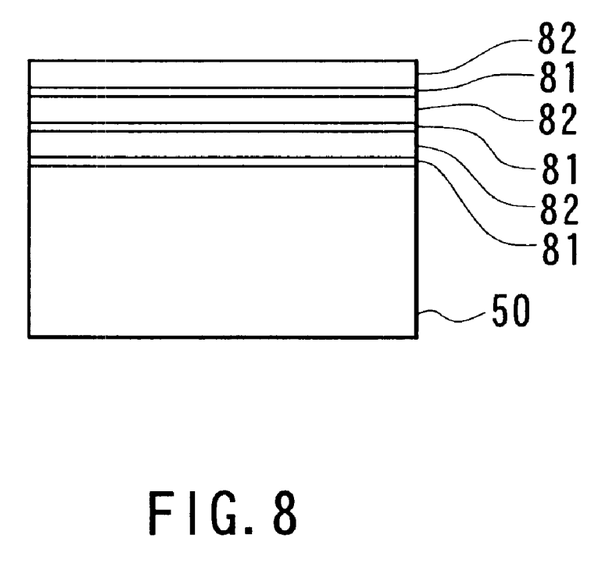
FIG. 8 is an explanatory view illustrating a structure of a thin-film head sink of a third embodiment of the invention.

Reference is now made to FIG. 8 to describe a structure of a thin-film heat sink of a third embodiment of the invention. The thin-film heat sink of the embodiment has a structure in which a plurality of bonding films 81 and a plurality of heat sink films 82 are alternately stacked on the base 50. The heat sink films 82 each function as a heat sink. The bonding film 81 has a function of bonding one heat sink film 82 to the base 50 or to another heat sink film 82 beneath it. In the present embodiment, an Al$_2$O$_3$ film formed through the CVD process is used as one bonding film 81 and an AlN film formed through the CVD process is used as one heat sink film 82.

According to the method of manufacturing the thin-film heat sink of the embodiment, an Al$_2$O$_3$ film as one bonding film 81 is formed on the base 50 using the CVD method and an AlN film as one heat sink film 82 is formed on the $Al_2O_3$ film, also using the CVD method. Subsequently, formation of the $Al_2O_3$ film and formation of the AlN film are repeated as many times as specified. The $Al_2O_3$ film and the AlN film may be consecutively formed through the CVD process.

In the present embodiment, as in the first and second embodiments, internal stress is compressive stress for the AlN film as the heat sink film 82, whereas internal stress is tensile stress for the $Al_2O_3$ film as the bonding film 81. Since the thin-film heat sink of the present embodiment has a structure in which a plurality of bonding films 81 and a plurality of heat sink films 82 are alternately stacked, the internal stress of the thin-film heat sink is better dispersed and radiation of heat is better equalized as compared to the case where the thin-film heat sink is made up of a single bonding film and a single heat sink film.

According to an example of the present embodiment, the $Al_2O_3$ film as the bonding film 81 has a thickness of 10 nm and the AlN film as the heat sink film 82 has a thickness of 40 nm, and three each of the $Al_2O_3$ films and AlN films are alternately stacked. The methods of forming the $Al_2O_3$ film and forming the AlN film are the same as those in the example of the second embodiment.

The peeling occurrence rate for the thin-film heat sink of the example of the embodiment was 3.5 percent at a load of 25 gf applied with the indenter, 10.2 percent at 50 gf and 12.6 percent at 100 gf. The internal stress of the thin-film heat sink of the example was 2.9 to $6.8 \times 10^5$ dyn/cm$^2$ (2.9 to $6.8 \times 10^4$ N/m$^2$), which was the lower limit of values measurable by the deflection method. The results demonstrate that the thin-film heat sink of the example of the embodiment has higher adhesiveness to the base and smaller internal stress than those of the two comparative examples in the first embodiment.

The remainder of the configuration, functions and effects of the present embodiment are similar to those of the first embodiment.

[Fourth Embodiment]

Figure 9:
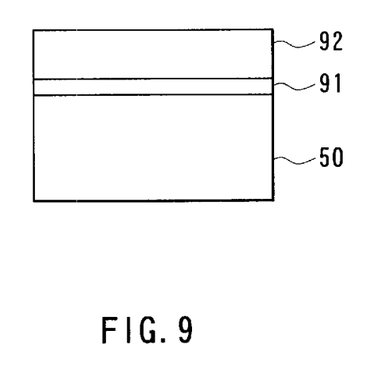
FIG. 9 is an explanatory view illustrating a structure of a thin-film head sink of a fourth embodiment of the invention.

Reference is now made to FIG. 9 to describe a structure of a thin-film heat sink of a fourth embodiment of the invention. The thin-film heat sink of the embodiment comprises a heat sink film 92 functioning as a heat sink, and a bonding film 91 for bonding the heat sink film 92 to the base 50. In the embodiment, a nitrogen-excessive silicon nitride ($SiN_x$, where x is larger than 1) film formed through the sputtering process is used as the bonding film 91 and an AlN film formed through the sputtering process is used as the heat sink film 92.

According to the method of manufacturing the thin-film heat sink of the embodiment, the $SiN_x$ film as the bonding film 91 is formed on the base 50 using the sputtering method, and the AlN film as the heat sink film 92 is formed on the $SiN_x$ film, also using the sputtering method. The $SiN_x$ film and the AlN film may be consecutively formed through the sputtering process.

It is known that a nitrogen-excessive silicon nitride ($SiN_x$) film has tensile stress on the order of $10^5$ dyn/cm$^2$ ($10^4$ N/m$^2$). Therefore, in the present embodiment, internal stress is compressive stress for the AlN film as the heat sink film 92, whereas internal stress is tensile stress for the $SiN_x$ film as the bonding film 91.

According to an example of the present embodiment, the $SiN_x$ film as the bonding film 91 is 30 nm thick and the AlN film as the heat sink film 92 is 120 nm thick.

A specific example of a method of manufacturing the thin-film heat sink of the example of the embodiment is now described. In this example, the $SiN_x$ film as the bonding film 91 was formed on the base 50 through the ECR sputtering process using an ECR sputtering device, and then the AlN film as the heat sink film 92 was successively formed through the ECR sputtering process using the same ECR sputtering device.

The conditions for forming the $SiN_x$ film as the bonding film 91 are as follows: use of single crystalline silicon (Si) as the target, use of Ar gas and $N_2$ gas as reaction gases, microwave power at 350 W, and the power of the high frequency wave applied to the target at 400 W.

If it is possible to form a nitrogen-excessive silicon nitride ($SiN_x$) film at a temperature of 300° C. or lower, the $SiN_x$ film as the bonding film 91 may be formed using a method other than the ECR sputtering method, such as facing target sputtering or plasma CVD.

The method of forming the AlN film as the heat sink film 92 is the same as the method used in the example of the first embodiment.

The peeling occurrence rate for the thin-film heat sink of the example of the embodiment was five percent at a load of 25 gf applied with the indenter, 12 percent at 50 gf and 18 percent at 100 gf. The internal stress of the thin-film heat sink of the example was 6.3 to $8.7 \times 10^5$ dyn/cm$^2$ (6.3 to $8.7 \times 10^4$ N/m$^2$), which was the lower limit of values measurable by the deflection method. The results demosntrate that the thin-film heat sink of the example of the embodiment has higher adhesiveness to the base and smaller internal stress than those of the two comparative examples in the first embodiment.

In the present embodiment, as in the third embodiment, the thinfilm heat sink may have a structure in which a plurality of $SiN_x$ films as the bonding films 91 and a plurality of AlN films as the heat sink films 92 are alternately stacked on the base 50. In this case, the $SiN_x$ films and the AlN films may be consecutively formed through the sputtering process.

The remainder of the configuration, functions and effects of the present embodiment are similar to those of the first embodiment.

[Fifth Embodiment]

Figure 10A:
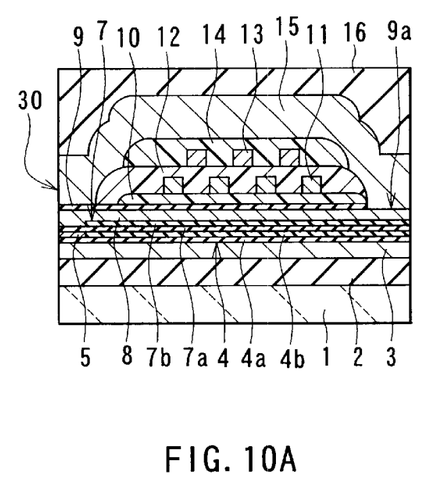
FIG. 10A and FIG. 10B are cross sections illustrating an example of a configuration of a thin-film magnetic head to which a fifth embodiment of the invention is applied.
Figure 10B:
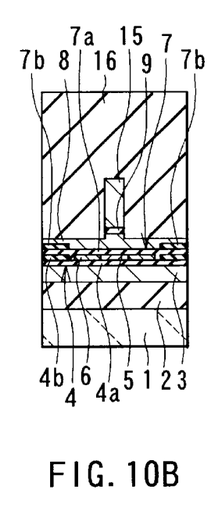

Reference is now made to FIG. 10A and FIG. 10B to describe a thin-film heat sink of a fifth embodiment of the invention. The thin-film heat sink of the embodiment is used as an insulating layer of a thin-film magnetic head.

FIG. 10A and FIG. 10B are cross sections illustrating an example of a configuration of a thin-film magnetic head to which the present embodiment of the invention is applied. The thin-film magnetic head comprises: a substrate 1 made of a ceramic material such as aluminum oxide and titanium carbide ($Al_2O_3$. TiC); an insulating layer 2 made of an insulating material and formed on the substrate 1; a read head provided on the insulating layer 2; a write head provided on the read head; and a protective layer 16 made of an insulating material and covering the read head. The thin-film magnetic head also has an air-bearing surface 30 as a medium facing surface that faces toward a recording medium.

The read head comprises: an MR element 5 for detecting a magnetic field; a pair of electrode layers 6 for feeding a sense current to the MR element 5; a bottom shield layer 3 and a top-shield-layer-cum-bottom-pole layer (hereinafter called a top shield layer) 8 sandwiching the MR element 5 and the electrode layers 6 therebetween to shield them; a bottom insulating layer 4 provided between the MR element 5 plus the electrode layers 6 and the bottom shield layer 3; and a top insulating layer 7 provided between the MR element 5 plus the electrode layers 6 and the top shield layer 8.

The bottom shield layer 3 is formed on the insulating layer 2. The bottom insulating layer 4 has a first insulating layer 4a and a second insulating layer 4b. The first insulating layer 4a is formed on the bottom shield layer 3. The MR element 5 and the electrode layers 6 are formed on the first insulating layer 4a. The second insulating layer 4b is formed on the first insulating layer 4a excluding a region around the MR element 5. The top insulating layer 7 has a first insulating layer 7a and a second insulating layer 7b. The first insulating layer 7a is formed to cover the bottom insulating layer 4, the MR element 5 and the electrode layers 6. The second insulating layer 7b is formed on the first insulating layer 7a excluding a region around the MR element 5.

The write head comprises: the bottom pole layer (top shield layer 8) and a top pole layer 15 that are magnetically coupled to each other and include magnetic pole portions located on a side of the air-bearing surface 30 and opposed to each other, each of the bottom and top pole layers including at least one layer; a write gap layer 9 provided between the magnetic pole portion of the bottom pole layer (top shield layer 8) and that of the top pole layer 15; and a thin-film coil a part of which is placed between the bottom pole layer (top shield layer 8) and the top pole layer 15 and insulated from the bottom and top pole layers. The thin-film coil has a first layer 11 and a second layer 13.

The write gap layer 9 is formed on the bottom pole layer (top shield layer 8). The write gap layer 9 has a contact hole 9a formed at a center portion of the thin-film coil. The first layer 11 of the thin-film coil is formed on an insulating layer 10 that is made of, for example, a heat-cured photoresist and formed on the write gap layer 9. The first layer 11 is covered with an insulating layer 12 made of, for example, a heat-cured photoresist. The second layer 13 of the thin-film coil is formed on the insulating layer 12. The second layer 13 is covered with an insulating layer 14 made of, for example, a heat-cured photoresist. The top pole layer 15 is formed in a region extending from the air-bearing surface 30 through the surfaces of the insulating layers 12 and 14 to the contact hole 9a. The top pole layer 15 is magnetically coupled to the bottom pole layer (top shield layer 8) through the contact hole 9a. The magnetic pole portion of the top pole layer 15 defines the write track width.

The thin-film heat sink of the present embodiment is used, for example, for the first insulating layer 4a of the bottom insulating layer 4 or the first insulating layer 7a of the top insulating layer 7.

The thin-film heat sink of the embodiment comprises, as that of the first embodiment, the heat sink film 52 functioning as a heat sink, and the bonding film 51 for bonding the heat sink film 52 to the base 50. An $Al_2O_3$ film formed through the CVD process is used as the bonding film 51, and an AlN film is used as the heat sink film 52. The AlN film may be formed by any method, such as the sputtering method, the CVD method or the vacuum evaporation method. In the method of manufacturing the thin-film heat sink of the present embodiment, the AlN film is formed by sputtering.

An example of the present embodiment is now described. According to the example, the bonding film 51 is a 10-nm-thick $Al_2O_3$ film formed through the CVD process and the heat sink film 52 is a 40-nm-thick AlN film formed through the ECR sputtering process. The methods of forming the bonding film 51 and forming the heat sink film 52 are the same as those used in the example of the first embodiment.

An insulating layer using the thin-film heat sink of the above example of the embodiment and insulating layers of two comparative examples were evaluated in terms of impacts on the characteristics of a thin-film magnetic head. The results are described below. The insulating layer of a first comparative example is a 50-nm-thick $Al_2O_3$ film formed through the ECR sputtering process. The insulating layer of a second comparative example is a 50-nm-thick AlN film formed through the ECR sputtering process.

When a sense current is fed to the MR element 5, the MR element 5 generates heat and its resistance value rises. Therefore, a difference in thermal conductivity of insulating layers emerges as a difference in resistance value of the MR element 5 when a sense current is fed thereto. Here, a resistance value of the MR element 5 when a sense current was fed thereto was therefore measured to evaluate an impact of thermal conductivity of an insulating layer on the characteristics of a thin-film magnetic head.

A difference in internal stress of insulating layers emerges as a difference in frequency of occurrence of Barkhausen noise in the read head. Barkhausen noise was therefore evaluated to evaluate an impact of internal stress of an insulating layer on the characteristics of a thin-film magnetic head. Although several methods are available for evaluating Barkhausen noise, one of the methods was employed here, in which the number of occurrences of baseline shifts was measured in the following manner. In the method, a square wave signal at 1 MHz was recorded on the innermost track of a 2.5-inch recording medium, and the signal was reproduced. In the isolated reproduction waveforms thus obtained, the number of occurrences of baseline shifts at seven percent or higher of the peak value was measured to regard it as the number of occurrences of baseline shifts.

For performing the above measurements, 25 each of thin-film magnetic heads with the insulating layer of the example of the embodiment, those with the insulating layer of the first comparative example, and those with the insulating layer of the second comparative example were prepared.

As a result, the resistance value of the MR element 5 was 33.2 to 38.5 Ω for the example of the embodiment, 45.9 to 48.3 Ω for the first comparative example, and 32.6 to 35.9 Ω for the second comparative example. The result shows that use of AlN, a heat sink material, for an insulating layer provides higher thermal conductivity of the insulating layer and promotes the release of heat from the MR element 5.

The results of measurement of the number of occurrences of baseline shifts were: 0 to 25 for the example of the embodiment; 50 to 150 for the first comparative example; and 230 to 380 for the second comparative example. The results show that the impact of internal stress of the insulating layer is apparently reduced in the example of the embodiment as compared to the comparative examples.

As thus described, use of the thin-film heat sink of the embodiment of the invention as the insulating layers 4a and 7a provided between the MR element 5 and the top and bottom shield layers 3 and 8, respectively, of the thin-film magnetic head, can improve the characteristics of the read head.

The thin-film heat sink of the embodiment may be used not only as the insulating layers 4a and 7a but also as other insulating layers of a thin-film magnetic head, such as the second insulating layer 4b of the bottom insulating layer 4, the second insulating layer 7b of the top insulating layer 7, and the write gap layer 9. In those cases as well, it is possible to reduce impacts of the thermal conductivity and internal stress of the insulating layers on the characteristics of the thin-film magnetic head, and as a result, it is possible to improve the characteristics of the thin-film magnetic head.

The remainder of the configuration, functions and effects of the present embodiment are similar to those of the first embodiment.

The present invention is not limited to the foregoing embodiments but may be practiced in still other ways. For example, not only the thin-film heat sink of the first embodiment but also those of the second to fourth embodiments may be used as an insulating layer of a thin-film magnetic head.

The thin-film heat sink of the invention may be used not only as an insulating layer of a thin-film magnetic head but also as a heat sink in various electronic components.

The heat sink film may be a film of a different material such as diamond, boron nitride of the cubic zincblende structure (c-BN) or low stress boron nitride (h-BN), instead of an AlN film. The bonding film may be a tinanium nitride (TiN) film, instead of an $Al_2O_3$ film or a $SiN_x$ film formed by CVD method.

As described above, according to the thin-film heat sink or the method of manufacturing the same of the invention, with the heat sink film having high thermal conductivity bonded to the base via the bonding film, it is possible to enhance adhesiveness of the thin-film heat sink to the base while attaining high thermal conductivity of the thin-film heat sink. Furthermore, according to the invention, the heat sink film and the bonding film having internal stresses in opposite directions, the thin-film heat sink as a whole has smaller internal stress.

Obviously many modifications and variations of the present invention are possible in light of the above teachings. It is therefore to be understood that within the scope of the appended claims the invention may be practiced otherwise than as specifically described.

What is claimed is:

1. A thin-film heat sink comprising: a heat sink film functioning as a heat sink; and a bonding film for bonding the heat sink film to a base, wherein:

one of the heat sink film and the bonding film is a film of which internal stress is compressive stress, and the other is a film of which internal stress is tensile stress, and the heat sink film is in direct contact with the bonding film.

2. A thin-film heat sink according to claim 1, wherein the heat sink film is a film of which internal stress is compressive stress, and the bonding film is a film of which internal stress is tensile stress.

3. A thin-film heat sink according to claim 1, wherein the heat sink film is an aluminum nitride (AlN) film.

4. A thin-film heat sink according to claim 1, wherein the bonding film is an aluminum oxide ($Al_2O_3$) film formed through chemical vapor deposition.

5. A thin-film heat sink according to claim 1, wherein the bonding film is a nitrogen-excessive silicon nitride ($SiN_x$, where x is larger than one) film.

6. A thin-film heat sink according to claim 1, having a structure in which a plurality of heat sink films and a plurality of bonding films are alternately stacked.

7. A thin-film heat sink according to claim 1, wherein the heat sink film has thermal conductivity of 0.8 W/mK or higher as thin film.

8. A thin-film heat sink according to claim 1, which is used as an insulating layer of a thin-film magnetic head.

* * * * *